United States Patent [19]
Wu et al.

[11] 4,229,502
[45] Oct. 21, 1980

[54] LOW-RESISTIVITY POLYCRYSTALLINE SILICON FILM

[75] Inventors: Chung P. Wu, Mercerville; Ronald K. Smeltzer, Princeton, both of N.J.

[73] Assignee: RCA Corporation, New York, N.Y.

[21] Appl. No.: 65,437

[22] Filed: Aug. 10, 1979

[51] Int. Cl.³ .............................................. B05D 3/06
[52] U.S. Cl. ......................... 428/446; 204/DIG. 11; 219/121 L; 427/82; 427/85; 427/86; 427/53.1; 428/538
[58] Field of Search .................... 427/53.1, 82, 85, 86; 204/DIG. 11; 219/121 L; 428/446, 538

[56] References Cited
U.S. PATENT DOCUMENTS

| | | | |
|---|---|---|---|
| 4,059,461 | 11/1977 | Fan et al. | 427/53.1 |
| 4,151,058 | 4/1979 | Kaplan et al. | 427/86 |
| 4,164,436 | 8/1979 | Ura et al. | 427/86 |

OTHER PUBLICATIONS

Chiang, "Semiconductor Silicon" 1973, pp. 285–291.
Chapman et al., "J. App. Phys." vol. 34, No. 11, Nov. 1963, pp. 3291–3295.

*Primary Examiner*—John H. Newsome
*Attorney, Agent, or Firm*—B. E. Morris; D. S. Cohen; T. H. Magee

[57] ABSTRACT

A method of fabricating a low-resistivity polycrystalline silicon film deposited on a substrate comprises the steps of doping the polycrystalline silicon film with boron in situ while depositing the film, to a concentration greater than $1 \times 10^{20}$ atoms/cm³, and then irradiating the film with a laser pulse. The present method may be utilized to fabricate a polycrystalline silicon film having a relatively small temperature coefficient of resistivity by electrically connecting a first irradiated part of the film with a second non-irradiated part in a manner allowing the two parts, having different temperature coefficients of resistivity, to compensate each other.

11 Claims, 3 Drawing Figures

LOW-RESISTIVITY POLYCRYSTALLINE SILICON FILM

This invention relates to a method of fabricating a low-resistivity polycrystalline silicon film, and the structure produced in accordance with this method including a polycrystalline silicon film having a relatively small temperature coefficient of resistivity.

Deposited films of doped polycrystalline silicon are used in large scale integrated (LSI) circuit devices as a conducting material in place of metallic conductors. These deposited films ordinarily overlie insulating material, which may be silicon dioxide and/or silicon nitride formed as a coating on a body of silicon, or may be sapphire in the so-called silicon-on-sapphire (SOS) technology. One example of the use of polycrystalline silicon as a conductor is the self-aligned gate metal-oxide semiconductor (MOS) device, in which a polycrystalline silicon film of defined shape serves as a gate electrode. Polycrystalline silicon is also used for fabricating polycrystalline silicon contacts and interconnects utilized for electrically connecting various active and passive elements deposited on the same integrated circuit chip.

Polycrystalline silicon films with dopings similar to those in monocrystalline silicon wafers or epitaxial layers have higher resistivity than the monocrystalline silicon. This is true both for gaseous doped, diffused or ion implanted polycrystalline silicon films. In order to reduce the resistivity of such films they are thermally annealed at high temperatures, typically by heating the films to 1,000° C. in dry nitrogen for approximately 15 minutes. In certain applications, such as radiation-hard integrated circuit devices, heating at such high temperatures degrades the operating performance of the device.

Recent experiments have shown that laser radiation can be successfully used to anneal monocrystalline silicon substrates which have been damaged by ion implantation. A thin layer of material at or near the surface of the crystal is damaged during the implantation, often being driven completely amorphous. Laser annealing has been utilized to restore the crystallativity of this implanted layer. However, an energy density of at least about 2 to 4 joules/cm$^2$ is required for single-crystal silicon, because the crystallization process takes place by first melting the silicon and then regrowing the layer adjacent the underlying single-crystal substrate. Also, the area of a typical integrated circuit wafer is about 25 cm$^2$ or greater. Since the maximum energy density available, using present technology, from a single laser pulse which irradiates the entire surface area is less than 2 joules/cm$^2$, such laser anneal requires some form of scanning mechanism utilizing a higher-power laser beam which irradiates a smaller surface area.

An economical method of reducing the resistivity of a doped polycrystalline silicon film to a value lower than that previously obtainable by thermal annealing is disclosed in the copending application of C. P. Wu, Ser. No. 963,818, filed on Nov. 27, 1978 and assigned to RCA Corporation. This method comprises the step of irradiating the film with a laser pulse having an energy density of less than about 1.5 joules/cm$^2$. The main limitation in utilizing polycrystalline silicon in LSI and VLSI (very large scale integration) applications is its higher-than-desired value of minimum resistivity. Current technology can achieve a sheet resistivity for polycrystalline silicon film somewhere between 10 to 30 ohms/square. However, applications in VLSI circuits require polycrystalline silicon layers with sheet resistivity around 5 to 6 ohms/square. The present invention is an improvement in the above method comprising a technique for obtaining a polycrystalline silicon film having an extremely low resistivity.

Figure 1:
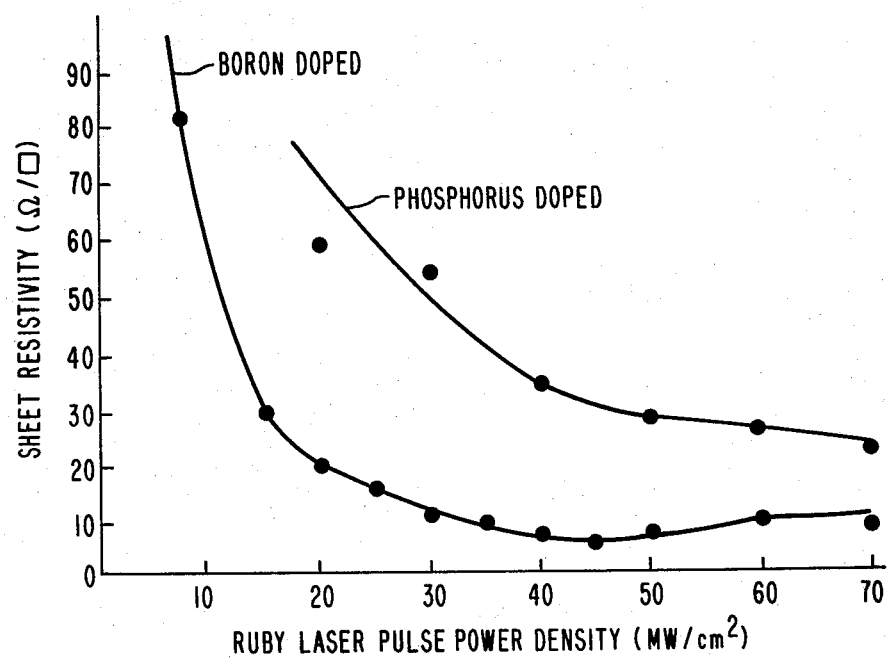
FIG. 1 is a graph illustrating the results of sheet resistivity as a function of laser pulse power density for laser-irradiated polycrystalline silicon film samples doped in situ with boron and phosphorus, respectively.

In accordance with the novel method of the present invention, a polycrystalline silicon film is doped in situ with boron to a concentration greater than $1 \times 10^{20}$ atoms/cm$^3$ while being deposited on a substrate. We believe that the only practical way of achieving such a high concentration of boron at the present time is by doping in situ, as contrasted with a thermal diffusion technique. The polycrystalline silicon layer may be deposited by any known technique, such as the conventionally known chemical vapor deposition process. In this process a gaseous source of silicon, such as silane (SiH$_4$), along with an inert carrier gas, such as nitrogen, and a doping gas are introduced into a reaction chamber. The temperature within the reaction chamber is such as to decompose the silane causing the silicon to deposit onto the substrates. The boron dopant is introduced typically by the addition of diborane (B$_2$H$_6$) to the gaseous reactants during the deposition process. Preferably, the concentration of boron in the polycrystalline silicon film is about $2 \times 10^{21}$ atoms/cm$^3$. In the present example, the substrate comprises a silicon-on-sapphire (SOS) wafer having a layer of silicon dioxide deposited thereon; the polycrystalline silicon film is deposited on the silicon dioxide layer to a thickness of about 0.6 $\mu$m.

The boron-doped polycrystalline silicon film is irradiated with a laser pulse. In the present embodiment we utilized a Q-switched ruby laser having a wavelength of 0.69 $\mu$m and a pulse duration time of about 30 nanoseconds. The pulse duration time may vary but is preferably between about 10 and about 50 nanoseconds. Samples of the film doped in situ with boron to a concentration of $2 \times 10^{21}$ atoms/cm$^3$ were irradiated with the ruby laser at different power densities ranging between about 7.5 MW/cm$^2$ and about 80 MW/cm$^2$, which are equivalent to a 30 manosecond laser pulse having an energy density between about 0.23 and about 2.4 joules/cm$^2$. Referring to Table I, there is shown the results of sheet resistivity measurements taken on the differently irradiated samples utilizing conventional four point probes for the measurements. Such films with thickness around 0.6 $\mu$m have a sheet resistivity typically between 80 and 100 ohms/square. However, Table I shows that pulse ruby laser annealing of such films in accordance with the present method can drastically reduce the sheet resistivity to 5–6 ohms/square ($\Omega/\square$) or 0.0003 $\Omega$-cm, a value previously never attained in polycrystalline silicon material.

TABLE I

SAMPLES DOPED IN SITU WITH BORON

| ENERGY DENSITY (JOULES/CM$^2$) | POWER DENSITY (MW/cm$^2$) | SHEET RESISTIVITY ($\rho_s(\Omega/\Box)$) |
|---|---|---|
| .23 | 7.5 | 81 |
| .45 | 15 | 29 |
| .60 | 20 | 19 |
| .75 | 25 | 15 |
| .90 | 30 | 10 |
| 1.05 | 35 | 9.4 |
| 1.20 | 40 | 6.9 |
| 1.35 | 45 | 5.0 |
| 1.50 | 50 | 7.6 |
| 1.80 | 60 | 9.7 |
| 2.10 | 70 | 8.0 |
| 2.40 | 80 | DAMAGE APPEARING |

TABLE II

SAMPLES DOPED IN SITU WITH PHOSPHORUS

| ENERGY DENSITY (JOULES/cm$^2$) | POWER DENSITY (MW/cm$^2$) | SHEET RESISTIVITY ($\rho_s(\Omega/\Box)$) |
|---|---|---|
| .6 | 20 | 59 |
| .9 | 30 | 54 |
| 1.2 | 40 | 34 |
| 1.5 | 50 | 28 |
| 1.8 | 60 | 26 |
| 2.1 | 70 | 22(PITTING) |

Similar samples were prepared by degeneratively doping polycrystalline silicon films with phosphorus in situ during the deposition step. Table II shows the results of sheet resistivity measurements taken on such samples after irradiation with the Q-switched ruby laser. Polycrystalline silicon films having low sheet resistivity comparable to the boron-doped films were unable to be obtained; the lowest value achieved was about 22 ohms/square at a power density of 70 MW/cm$^2$. In both the boron and phosphorus doped samples, irradiation with a laser pulse beyond a certain energy density caused surface damage to start appearing, in particular, pitting. Consequently, the boron and phosphorus doped samples were not laser annealed above power densities of about 80 and 70 MW/cm$^2$, respectively. A comparison of the boron doped samples with the phosphorus doped samples is illustrated graphically in FIG. 1.

We also irradiated, with a ruby laser pulse, polycrystalline silicon films doped to maximum dopant concentration using conventional diffusion techniques. However, such techniques also resulted in films having higher sheet resistivity values than the above shown resistivity values for films doped in situ with boron. It therefore appears to us that the pulse laser annealing of in situ boron-doped polycrystalline silicon films is a unique combination which produces the lowest possible sheet resistivity in polycrystalline silicon material.

Figure 2:
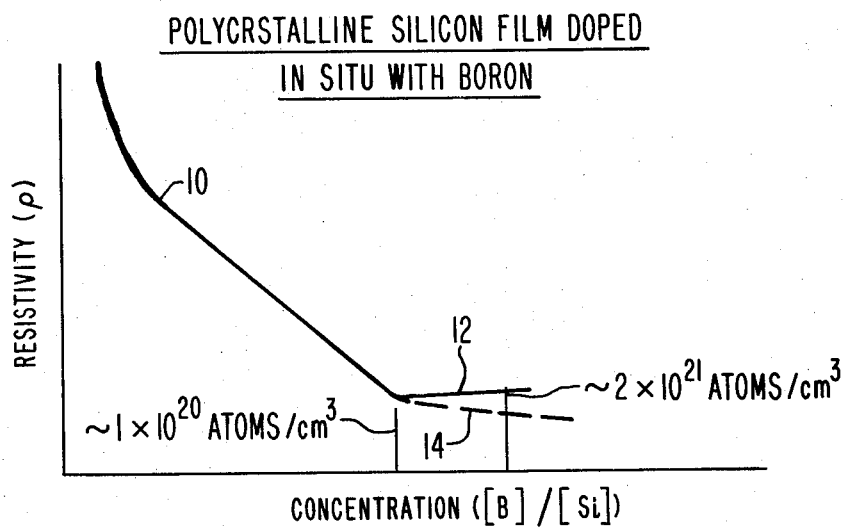
FIG. 2 is a diagrammatic curve illustrating how the sheet resistivity varies as a function of the concentration of boron in a heavily-doped polycrystalline silicon film.

The essence of the present invention resides in the discovery that laser irradiation can achieve almost complete electrical activation of boron atoms in a polycrystalline silicon film degeneratively doped in situ to a concentration greater than $1 \times 10^{20}$ atoms/cm$^3$. Referring to FIG. 2, there is shown a diagrammatic curve 10 illustrating how the sheet resistivity of such a film varies as a function of the concentration of the boron ([B]/[Si]) in the silicon film. Up to about $1 \times 10^{20}$ atoms/cm$^3$, the resistivity decreases with increasing boron concentration. However, as the film becomes degenerately doped beyond this level and up to the level of the preferred embodiment, i.e., about $2 \times 10^{21}$ atoms/cm$^3$, the resistivity actually increases slightly, as shown by the upswing portion 12 of the curve 10. This slight increase may be explained by the fact that the additional boron atoms do not become electrically activated but act as scattering centers for the carriers. We believe that the present laser irradiation step eliminates this resistivity increase and actually achieves a lower resistivity film, as illustrated by the dotted line 14, by causing many more of the boron atoms to become electrically activated and by increasing carrier mobility as a result of grain growth. This increased electrical activation cannot be achieved by conventional thermal annealing. In fact, we have observed that a subsequent high-temperature annealing step actually destroys the benefits achieved by the present invention.

Figure 3:
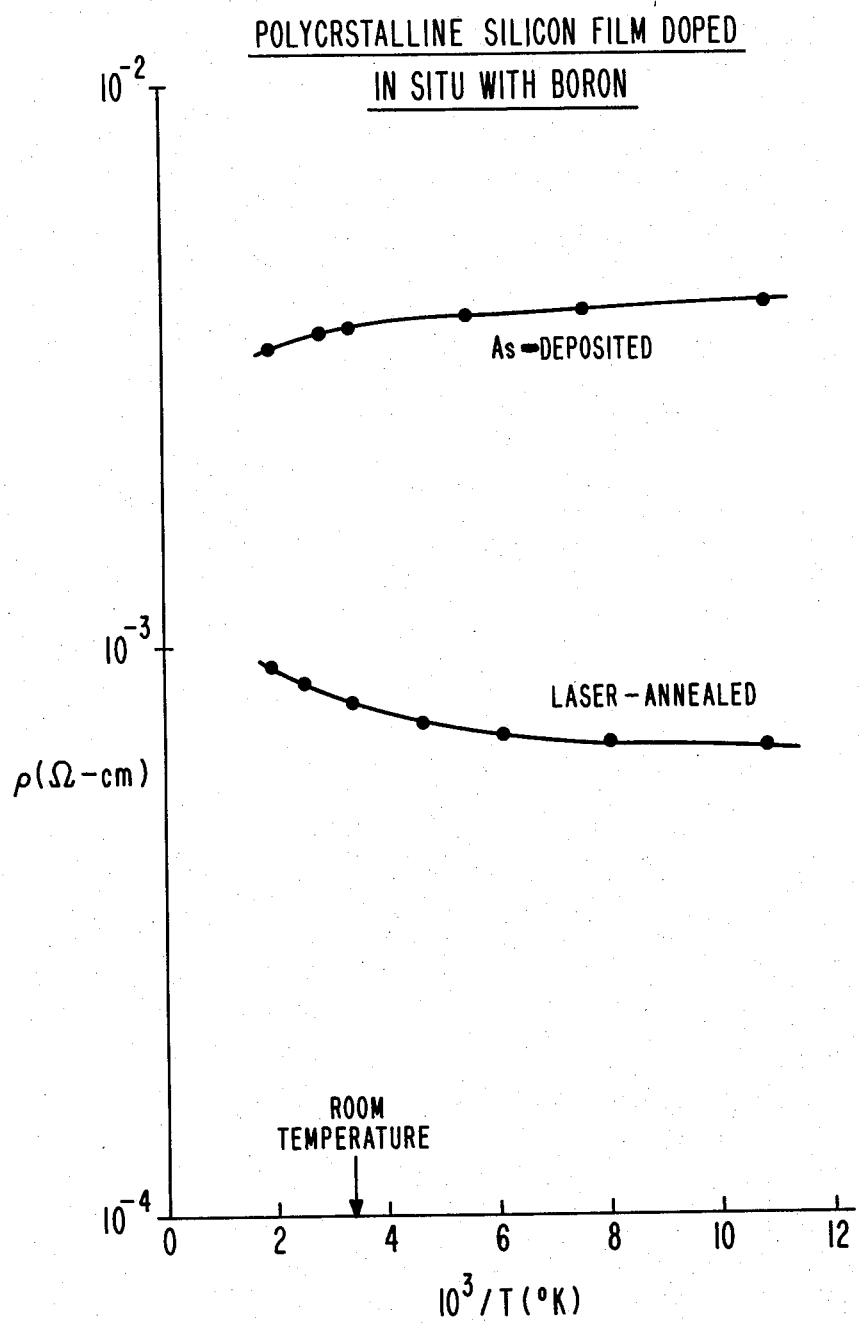
FIG. 3 is a graph illustrating the results of resistivity as a function of temperature for both as-deposited and laser-annealed polycrystalline silicon films degenerately doped in situ with boron.

We have observed that a polycrystalline silicon film, degenerately doped with boron in situ during its deposition to a concentration of about $2 \times 10^{21}$ atoms/cm$^3$, exhibits a negative temperature coefficient of resistivity. However, after laser irradiation in accordance with the present method, such film exhibits a positive temperature coefficient of resistivity. Referring to FIG. 3, resistivity as a function of temperature is plotted for both the as-deposited film prior to laser irradiation, and the laser-annealed film.

In order to fabricate a polycrystalline silicon film having a relatively small coefficient of resistivity, we propose degenerately doping a polycrystalline silicon film with boron in situ to a concentration greater than $1 \times 10^{20}$ atoms/cm$^3$. Only a first part of this doped film is laser irradiated in accordance with the above-described technique. This first part is then electrically connected with a second nonirradiated part of the film in a known manner allowing the two parts, having different temperature coefficients of resistivity, to compensate each other. For example, the two parts may be simply adjacent portions of the same film connected in series. The two parts of the compensated resistor may also be electrically connected in parallel, or in any type of series/parallel combination known in the art. The fabrication of resistors utilized in VLSI applications would be especially impacted by this process since relatively thin polycrystalline silicon films would be strongly affected by temperature variations. Such a fabrication technique for polycrystalline silicon may have utility in other applications, such as strain gauges and piezoelectric devices.

What is claimed is:

1. In a method of fabricating a low-resistivity polycrystalline silicon film including the step of depositing said film on a substrate, the improvement in said method comprising the steps of:
   doping said polycrystalline silicon film with boron in situ during said depositing step to a concentration greater than $1 \times 10^{20}$ atoms/cm$^3$ and then
   irradiating said film with a laser pulse.

2. A method as recited in claim 1 wherein said doping step is performed so that the concentration of boron in said polycrystalline silicon film is about $2 \times 10^{21}$ atoms/cm$^3$.

3. A method as recited in claim 1 wherein said laser pulse has a power density of between about 7.5 MW/cm$^2$ and about 80 MW/cm$^2$.

4. A method as recited in claim 1 wherein said laser is a Q-switched ruby laser having a pulse duration time of about 30 nanoseconds.

5. A method as recited in claim 1 wherein said substrate comprises a silicon wafer having a layer of silicon dioxide disposed thereon, said polycrystalline silicon film being deposited on the silicon dioxide layer.

6. A method as recited in claim 5 wherein said polycrystalline silicon film has a thickness of about 0.6 μm.

7. A structure produced in accordance with the method of claim 1.

8. In a method of fabricating a polycrystalline silicon film having a relatively small temperature coefficient of resistivity, including the step of depositing said film on a substrate, the improvement in said method comprising the steps of:

doping said polycrystalline silicon film with boron in situ during said depositing step to a concentration greater than $1 \times 10^{20}$ atoms/cm$^3$, irradiating a first part of said doped film with a laser pulse, and electrically connecting said first part of said film with a second nonirradiated part of said film in a manner allowing the two parts, having different temperature coefficients of resistivity, to compensate each other.

9. A method as recited in claim 8 wherein said doping step is performed so that the concentration of boron in said polycrystalline silicon film is about $2 \times 10^{21}$ atoms/cm$^3$.

10. A method as recited in claim 8 wherein said laser pulse has a power density of between about 7.5 MW/cm$^2$ and about 80 MW/cm$^2$.

11. A structure produced in accordance with the method of claim 8.

* * * * *